(12) United States Patent
Higman et al.

(10) Patent No.: US 7,386,821 B2
(45) Date of Patent: Jun. 10, 2008

(54) PRIMITIVE CELL METHOD FOR FRONT END PHYSICAL DESIGN (75) Inventors: Jack M. Higman, Austin, TX (US); Ertugrul Demircan, Austin, TX (US); Edward O. Travis, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/423,240

(22) Filed: Jun. 9, 2006

(65) Prior Publication Data

US 2008/0005717 A1    Jan. 3, 2008

(51) Int. Cl.
*G06F 17/50* (2006.01)

(52) U.S. Cl. .............................. 716/7; 716/10

(58) Field of Classification Search ............... 716/1–18
See application file for complete search history.

(56) References Cited

U.S. PATENT DOCUMENTS

| | | | |
|---|---|---|---|
| 4,613,940 A | 9/1986 | Shenton et al. | |
| 4,700,316 A | 10/1987 | Nair | |
| 6,335,640 B1 | 1/2002 | Okamoto | |
| 6,804,809 B1 * | 10/2004 | West et al. | 716/11 |
| 2004/0003363 A1 | 1/2004 | Odilavadze et al. | |
| 2004/0228066 A1 * | 11/2004 | Sakurabayashi et al. | 361/302 |
| 2006/0026545 A1 * | 2/2006 | Allen et al. | 716/9 |

\* cited by examiner

*Primary Examiner*—Sun J. Lin
*Assistant Examiner*—Aric Lin
(74) *Attorney, Agent, or Firm*—Michael J. Balconi-Lamica; Joanna G. Chiu (57) ABSTRACT

A method for forming an integrated circuit (280) comprises accessing (282) a library of primitive cells and edge codes in the formation of an integrated circuit layout. At least one edge code of at least one previously placed primitive cell (284) of the integrated circuit layout is used. A primitive cell is selected (286) from the library that is compatible with the at least one previously placed primitive cell and the selected primitive cell is placed into the integrated circuit layout adjacent the at least one previously placed primitive cell. The integrated circuit is manufactured (290) using the integrated circuit layout.

5 Claims, 5 Drawing Sheets

PRIMITIVE CELL METHOD FOR FRONT END PHYSICAL DESIGN

BACKGROUND

The present disclosures relate to integrated circuit manufacturing, and more particularly, to a primitive cell method for front end physical design for integrated circuit manufacturing.

Problems exist in the current designing and building of electronic systems in integrated circuits. These problems include, but are not limited to, (1)complex front-end design rules, (2) complexity and inaccuracy of translating written design rules into Design Rule Check (DRC) code, (3) difficulty or impossibility to achieve one hundred percent (100%) coverage with DRC Quality Assurance (QA) cells, (4) an inability of layout designers to comprehend written rules, wherein a corresponding layout is performed by trial-and-error, and layout checking is performed with (imperfect) DRC decks that correspond to machine readable code of the design rules, (5) an inaccuracy of front-end device models with respect to silicon due to small layout variations, (6) transistor variability on chip due to randomness in physical design, (7) 65 nm and beyond process requires post-layout extraction to comprehend non-local effects (stressors, etc.) on front-end device models, and (8) irregular front-end layout practices complicate the generation of derived layers (e.g., stressor films), and create unexpected flaws such as slivers/gaps.

With current layout design proposals, variations in layout style increase variability in device electrical behavior. Neighboring structures within the layout have an increasing effect on electrical behavior and complicates modeling. Current methods to comprehend these effects require the use of very complex post-layout extraction to back annotate models for simulation. Even with the post layout extraction, the ability of the models to accurately represent the electrical behavior of all devices is poor. Furthermore, design rules are increasing in complexity so rapidly that existing paradigms cannot continue to handle them.

Accordingly, there is a need for an improved method and apparatus for overcoming the problems in the art as discussed above.

BRIEF DESCRIPTION OF THE DRAWINGS

The present embodiments are illustrated by way of example and not limited by the accompanying figures, in which like references indicate similar elements, and in which.

The use of the same reference symbols in different drawings indicates similar or identical items. Skilled artisans will also appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
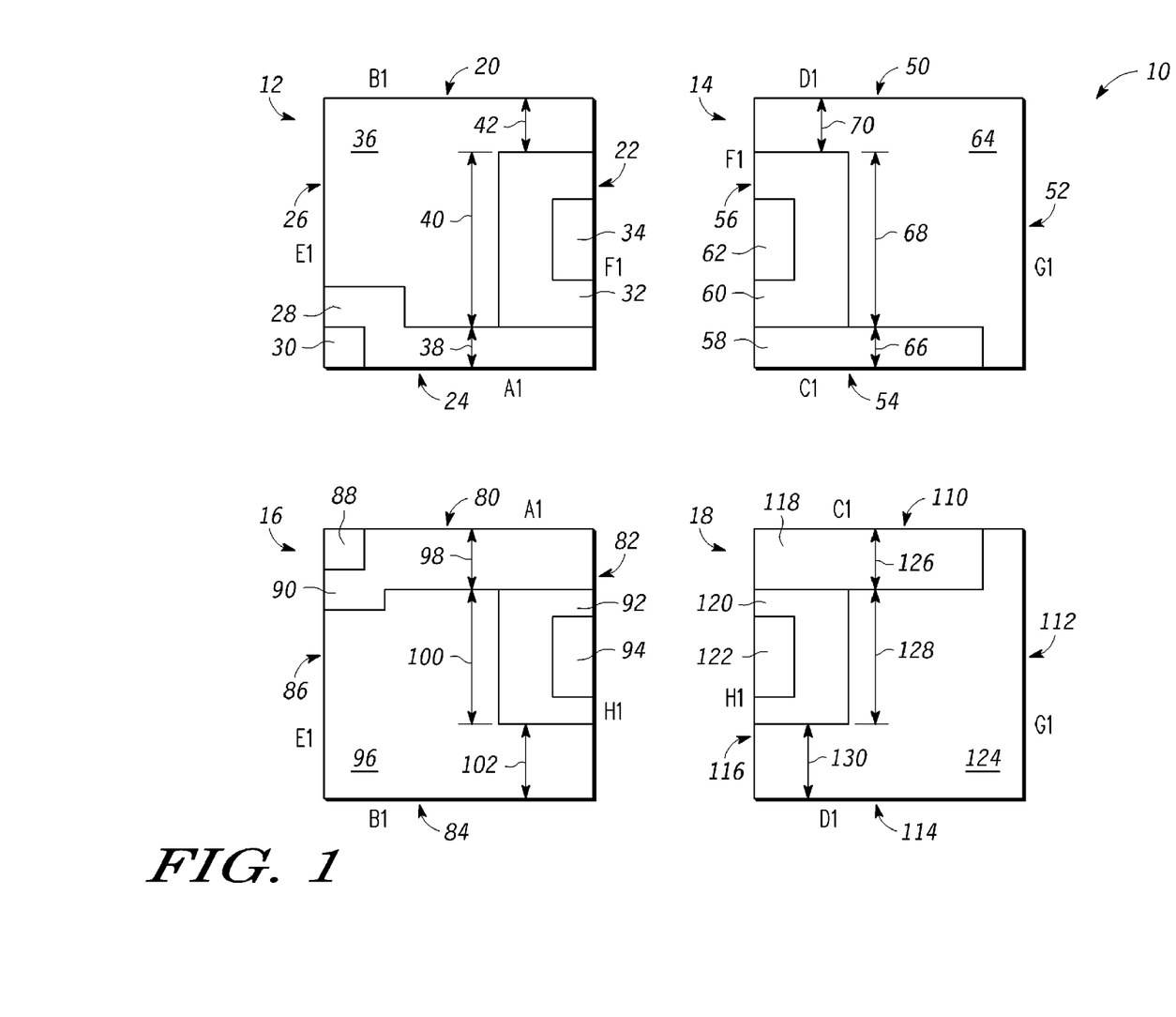
FIG. 1 is a schematic expanded layout view of primitive cells of a physical design layout, the primitive cells having a same size and including partial-layout features according to one embodiment of the present disclosure.

FIG. 1 is a schematic expanded layout view 10 of primitive cells of a portion of a physical design layout, the primitive cells having a same size dimension (i.e., length and width) and including partial-layout features according to one embodiment of the present disclosure. In FIG. 1, the primitive cells are generally indicated by reference numerals 12, 14, 16 and 18. Primitive cell 12 includes four side edges 20, 22, 24, and 26. Each side edge of the primitive cell is characterized by a predetermined edge code, to be discussed further herein. Primitive cell 12 further includes partial-layout features 28, 30, 32, and 34. Furthermore, a portion of primitive cell 12 includes a region or feature other than partial-layout features, generally indicated by reference numeral 36.

As discussed herein, the partial-layout features are representative of one or more portions of a semiconductor device of an integrated circuit. In other words, a partial-layout feature by itself would not suffice as a functional portion of a semiconductor device of an integrated circuit. In FIG. 1, the primitive cell 12 is representative of a portion of a transistor layout, wherein partial-layout feature 28 is representative of a portion of a gate electrode. The gate electrode comprises any suitable electrode material or stack of materials selected according to the requirements of a given transistor device application. For example, the gate electrode may comprise polysilicon.

The partial-layout feature 30 is representative of a portion of a gate electrode contact. The gate electrode contact comprises any suitable contact material or materials selected according to the requirements of a given transistor device application. For example, the gate electrode contact may comprise tungsten. The partial-layout feature 32 is representative of a portion of an active region of the transistor device, in particular, a source/drain region. The active region comprises any suitable semiconductor material or materials selected according to the requirements of a given transistor device application. For example, the active region may comprise silicon, germanium, gallium arsenide, combinations thereof, and/or strained versions of the same, etc.

The partial-layout feature 34 is representative of a portion of an active area contact. The active area contact comprises any suitable contact material or materials selected according to the requirements of a given device application. For example, the active area contact may comprise tungsten. The portion of primitive cell 12 indicated by reference numeral 36 is representative of a portion of an isolation region, which is a region or feature other than a partial-layout feature. The isolation region comprises any suitable isolation material or materials selected according to the requirements of a given transistor device application. For example, the isolation region may comprise an oxide.

Further with respect to primitive cell 12 of FIG. 1, several dimensions are illustrated by reference numerals 38, 40 and 42. Dimension 38 is representative of a partial gate length of a gate electrode. Dimension 40 is representative of a length of a source/drain extension, beyond the gate electrode. Dimension 42 is representative of a portion of an isolation region 36 within primitive cell 12. In particular, dimension 42 comprises a dimension that is defined according to a design rule regarding the spacing between adjacent active regions. Accordingly, when primitive cell 12 is coupled to another cell at edge 20, there is provided an appropriate isolation between adjacent active regions according to the design rules for the given technology.

Further with respect to FIG. 1, primitive cell 14 includes four side edges 50, 52, 54, and 56. Each side edge of the primitive cell is characterized by a predetermined edge code, as will be discussed further herein. Primitive cell 14 further includes partial-layout features 58, 60, and 62. Furthermore, a portion of primitive cell 14 includes a region or feature other than partial-layout features, generally indicated by reference numeral 64.

The primitive cell 14 is representative of another portion of a transistor layout, wherein partial-layout feature 58 is representative of a portion of a gate electrode. As discussed above, the gate electrode comprises any suitable electrode material or stack of materials selected according to the requirements of a given transistor device application. The partial-layout feature 60 is representative of a portion of an active region of the transistor device, in particular, a source/drain region. As discussed above, the active region comprises any suitable semiconductor material or materials selected according to the requirements of a given transistor device application. The partial-layout feature 62 is representative of a portion of an active area contact. As discussed above, the active area contact comprises any suitable contact material or materials selected according to the requirements of a given transistor device application. Furthermore, the portion of primitive cell 14 indicated by reference numeral 64 is representative of a portion of an isolation region, which is a region or feature other than a partial-layout feature. As discussed above, the isolation region comprises any suitable isolation material or materials selected according to the requirements of a given device application.

Further with respect to primitive cell 14 of FIG. 1, several dimensions are illustrated by reference numerals 66, 68 and 70. Dimension 66 is representative of a partial gate length of a gate electrode. Dimension 68 is representative of a length of a source/drain extension, beyond the gate electrode. Dimension 70 is representative of a portion of an isolation region 64 within primitive cell 14. In particular, dimension 70 comprises a dimension that is defined according to a design rule regarding the spacing between adjacent active regions. Accordingly, when primitive cell 14 is coupled to another cell at edge 50, there is provided an appropriate isolation between adjacent active regions according to the design rules for the given technology.

Primitive cell 16 is similar to primitive cell 12, for example, primitive cell 16 includes four side edges 80, 82, 84, and 86. Each side edge of the primitive cell is characterized by a predetermined edge code, as will be discussed further herein. Primitive cell 16 further includes partial-layout features 88, 90, 92, and 94. Furthermore, a portion of primitive cell 16 includes a region or feature other than a partial-layout feature, generally indicated by reference numeral 96. Primitive cell 16 is representative of another portion of a transistor layout, wherein partial-layout feature 90 is representative of a portion of a gate electrode. The gate electrode comprises any suitable electrode material or stack of materials selected according to the requirements of a given transistor device application.

The partial-layout feature 88 is representative of a portion of a gate electrode contact. The gate electrode contact comprises any suitable contact material or materials selected according to the requirements of a given device application. The partial-layout feature 92 is representative of a portion of an active region of the transistor device, in particular, a source/drain region. The active region comprises any suitable semiconductor material or materials selected according to the requirements of a given transistor device application. The partial-layout feature 94 is representative of a portion of an active area contact. The active area contact comprises any suitable contact material or materials selected according to the requirements of a given transistor device application. The portion of primitive cell 16 indicated by reference numeral 96 is representative of a portion of an isolation region, which is a region or feature other than a partial-layout feature. The isolation region comprises any suitable isolation material or materials selected according to the requirements of a given transistor device application.

Further with respect to primitive cell 16 of FIG. 1, several dimensions are illustrated by reference numerals 98, 100 and 102. Dimension 98 is representative of a partial gate length of a gate electrode. Dimension 100 is representative of a length of a source/drain extension, beyond the gate electrode. Dimension 102 is representative of a portion of an isolation region 96 within primitive cell 16. In particular, dimension 102 comprises a dimension that is defined according to a design rule regarding the spacing between adjacent active regions. Accordingly, when primitive cell 16 is coupled to another cell at edge 84, there is provided an appropriate isolation between adjacent active regions according to the design rules for the given technology.

Primitive cell 18 is similar to primitive cell 14, for example, primitive cell 18 includes four side edges 110, 112, 114, and 116. Each side edge of the primitive cell is characterized by a predetermined edge code, as will be discussed further herein. Primitive cell 18 further includes partial-layout features 118, 120, and 122. Furthermore, a portion of primitive cell 18 includes a region or feature other than a partial-layout feature, generally indicated by reference numeral 124.

The primitive cell 18 is representative of another portion of a transistor layout, wherein partial-layout feature 118 is representative of a portion of a gate electrode. As discussed above, the gate electrode comprises any suitable electrode material or stack of materials selected according to the requirements of a given device application. The partial-layout feature 120 is representative of a portion of an active region of the transistor device, in particular, a source/drain region. As discussed above, the active region comprises any suitable semiconductor material or materials selected according to the requirements of a given transistor device application. The partial-layout feature 122 is representative of a portion of an active area contact. In addition, as discussed above, the active area contact comprises any suitable contact material or materials selected according to the requirements of a given transistor device application. Furthermore, the portion of primitive cell 18 indicated by reference numeral 124 is representative of a portion of an isolation region, which is a region or feature other than a partial-layout feature. Moreover, as discussed above, the isolation region comprises any suitable isolation material or materials selected according to the requirements of a given transistor device application.

Further with respect to primitive cell 18 of FIG. 1, several dimensions are illustrated by reference numerals 126, 128 and 130. Dimension 126 is representative of a partial gate length of a gate electrode. Dimension 128 is representative of a length of a source/drain extension, beyond the gate electrode. Dimension 130 is representative of a portion of an isolation region 124 within primitive cell 18. In particular, dimension 130 comprises a dimension that is defined according to a design rule regarding the spacing between adjacent active regions. Accordingly, when primitive cell 18 is coupled to another cell at edge 114, there is provided an appropriate isolation between adjacent active regions according to the design rules for the given technology.

As discussed above with respect to the primitive cells of FIG. 1, each edge is characterized by a predetermined edge code. In one embodiment, the edge code for a corresponding edge comprises computer readable code that provides compatibility information with respect to that edge of the primitive cell. Compatibility information comprises information for identification of edges of other primitive cells that the instant cell can be adjacent to in a layout, thus insuring the generation of an error free layout. For illustration purposes, edge codes are represented various letters/numerals A1, B1, C1, D1, E1, F1, G1, and H1 are shown in FIG. 1.

According to one embodiment, primitive front-end layout elements (also referred to as primitive cells) are provided, which can constitute, for example, portions of transistors or other devices (e.g., passive or active). The primitive cells have edges that are coded in a manner such that only the intended abutment possibilities are allowed. The allowed abutments are designed as a function of or based upon the intended process technology capability, such that correct placement/abutment of the primitive cells guarantees a design rule clean layout.

Figure 2:
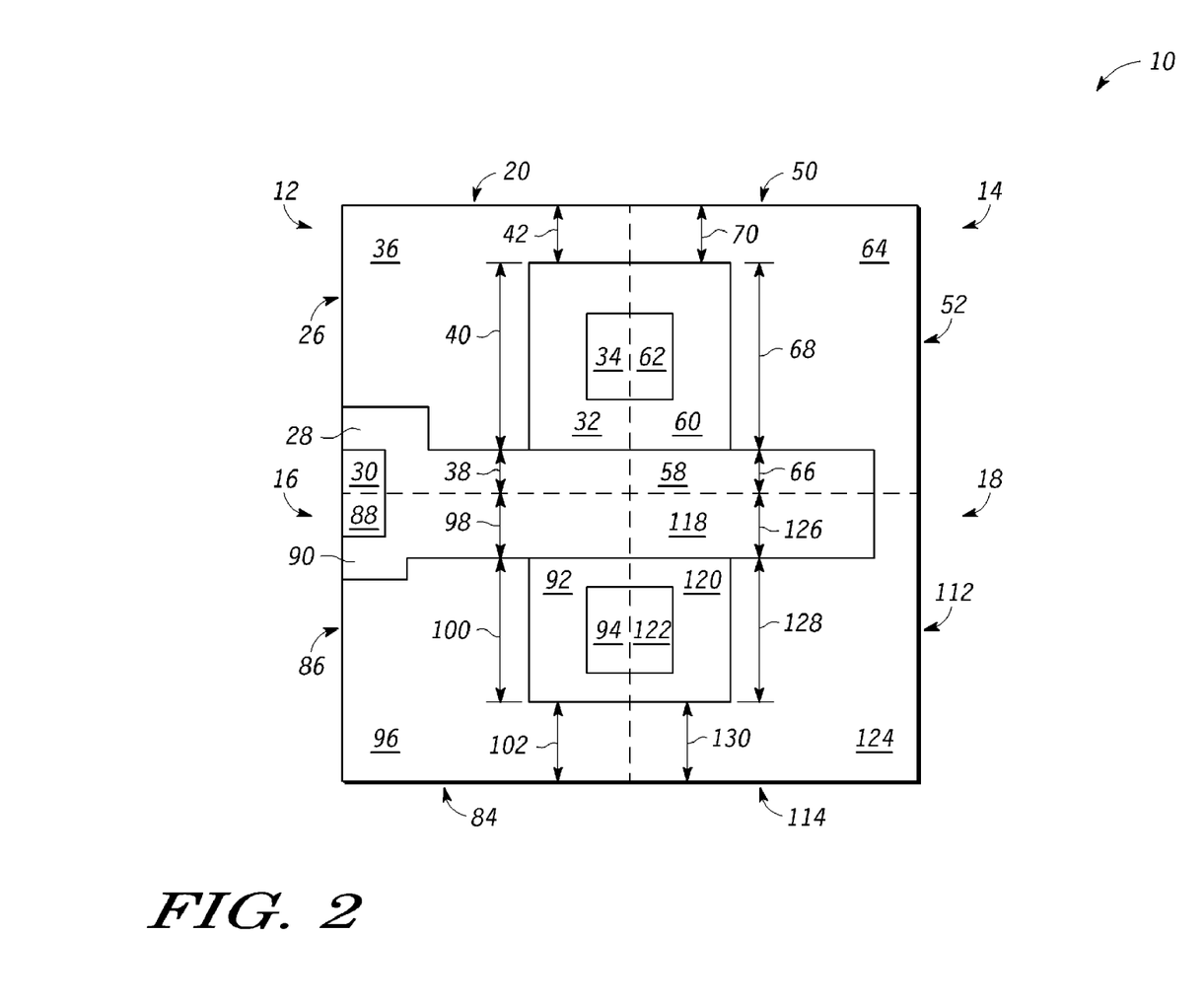
FIG. 2 is a schematic layout view of the primitive cells of the physical design layout of FIG. 1 coupled together based upon edge code compatibility, according to one embodiment of the present disclosure.

FIG. 2 is a schematic layout view of the primitive cells of the physical design layout of FIG. 1 coupled together based upon edge code compatibility, according to one embodiment of the present disclosure. In particular, in response to a determination of an edge code compatibility, side edge 22 of primitive cell 12 couples with side edge 56 of primitive cell 14. Side edge 54 of primitive cell 14 couples with side edge 110 of primitive cell 18. Side edge 116 of primitive cell 18 couples with side edge 82 of primitive cell 16. In addition, side edge 80 of primitive cell 16 couples with side edge 24 of primitive cell 12. As a result of the coupling together based upon edge code compatibility, partial-layout features 34 and 62 together form a full-layout active area contact feature. Partial-layout features 32 and 60 together form a full-layout active region feature, such as a source/drain region. Partial-layout features 94 and 122 together form another full-layout active area contact feature. In addition, partial-layout features 92 and 120 together form another full-layout active region feature, such as a source/drain region. Furthermore, partial-layout features 28, 58, 90 and 118 together form a substantially complete full-layout gate electrode feature, wherein the gate electrode feature has a width dimension which is the sum of dimensions 38 and 98 (or 66 and 126). Still further, partial-layout features 30 and 88 together form a partially complete full-layout gate electrode contact feature.

Figure 3:
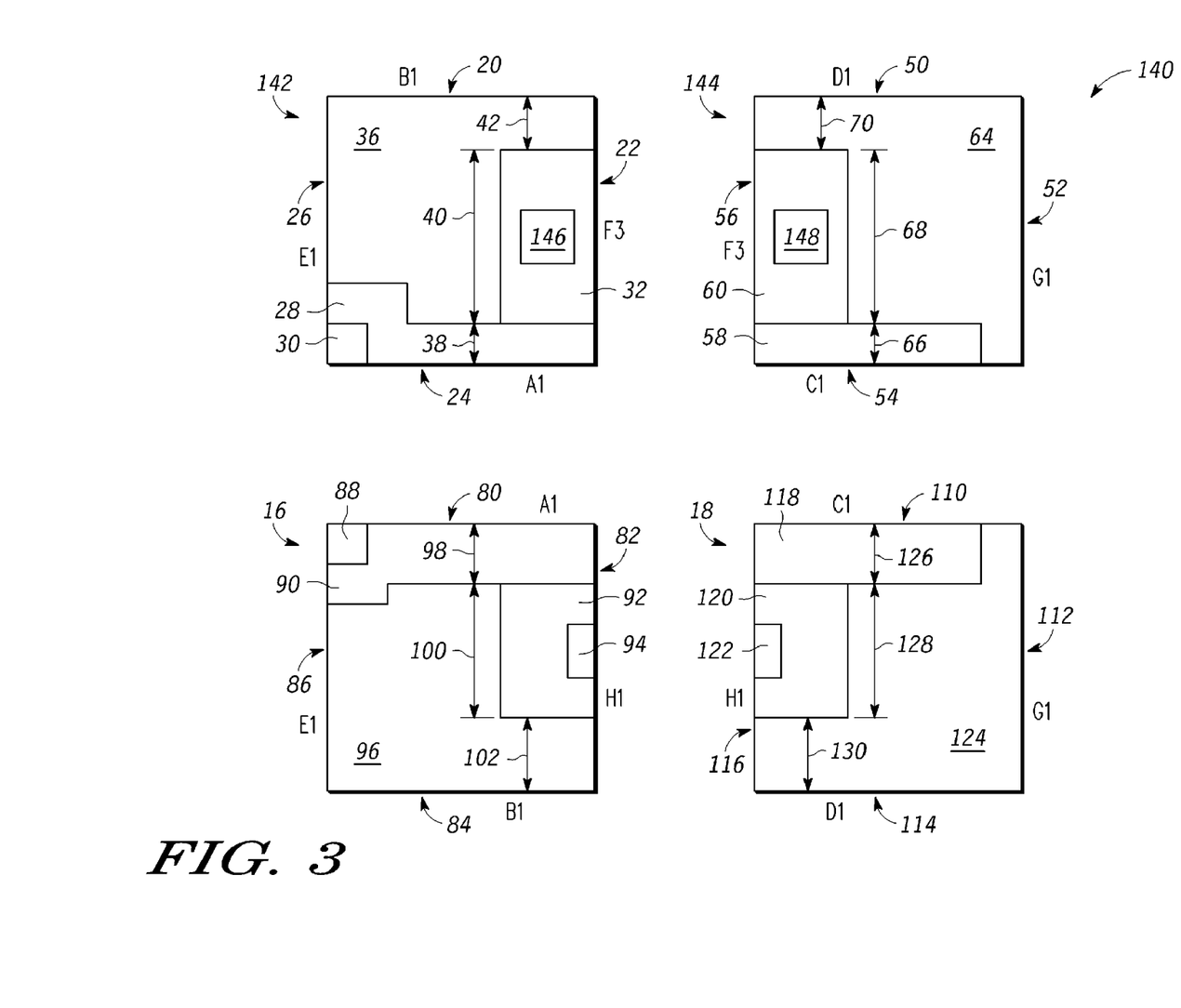
FIG. 3 is a schematic expanded layout view of primitive cells of another physical design layout, the primitive cells each having a same size and including partial-layout features as well as full-layout features according to another embodiment of the present disclosure.

FIG. 3 is a schematic expanded layout view 140 of primitive cells of another physical design layout, the primitive cells each having a same size and including partial-layout features as well as full-layout features according to another embodiment of the present disclosure. The layout view of FIG. 3 is similar to that of FIG. 1, with the following differences. In FIG. 3, the primitive cells are generally indicated by reference numerals 142, 144, 16 and 18. Primitive cell 142 includes four side edges 20, 22, 24, and 26. Each side edge of the primitive cell is characterized by a predetermined edge code, for example, represented by B1, F3, A1 and E1. Primitive cell 142 further includes both partial-layout features (28, 30 and 32) and a full-layout feature (146). Furthermore, a portion of primitive cell 142 includes a region or feature other than partial-layout features, generally indicated by reference numeral 36.

As discussed herein, the partial-layout features are representative of one or more portions of a semiconductor device of an integrated circuit. In other words, a partial-layout feature by itself would be insufficient to suffice as a functional portion of a semiconductor device of an integrated circuit. In addition, a full-layout feature is representative of a functional portion of a semiconductor device. In FIG. 3, the primitive cell 142 is representative of a portion of a transistor layout, wherein partial-layout feature 28 is representative of a portion of a gate electrode, partial layout feature 30 is representative of a portion of a gate electrode contact, and partial-layout feature 32 is representative of a portion of an active region of the transistor device, in particular, a source/drain region. The full-layout feature 146 is representative of an active area contact. The active area contact comprises any suitable contact material or materials selected according to the requirements of a given device application. For example, the active area contact may comprise tungsten.

Further with respect to FIG. 3, primitive cell 144 includes four side edges 50, 52, 54, and 56. Each side edge of the primitive cell is characterized by a predetermined edge code, for example, represented by D1, G1, C1 and F3. Primitive cell 144 further includes both partial-layout features (58 and 60) and a full-layout feature (148). Furthermore, a portion of primitive cell 144 includes a region or feature other than partial-layout features, generally indicated by reference numeral 64.

The primitive cell 144 is representative of another portion of a transistor layout, wherein partial-layout feature 58 is representative of a portion of a gate electrode, and the partial-layout feature 60 is representative of a portion of an active region of the transistor device, in particular, a source/drain region. The full-layout feature 148 is representative of an active area contact. As discussed above, the active area contact comprises any suitable contact material or materials selected according to the requirements of a given transistor device application. In addition, primitive cells 16 and 18 are as discussed herein above with respect to FIG. 1.

As discussed above with respect to the primitive cells of FIG. 1, each edge is characterized by a predetermined edge code. In one embodiment, the edge code for a corresponding edge comprises computer readable code that provides compatibility information with respect to that edge of the primitive cell. Compatibility information comprises information for identification of edges of other primitive cells that the instant cell can be adjacent to in a layout, thus insuring the generation of an error free layout. For illustration purposes, edge codes are represented various letters/numerals A1, B1, C1, D1, E1, F1, G1, and H1 are shown in FIG. 1.

Figure 4:
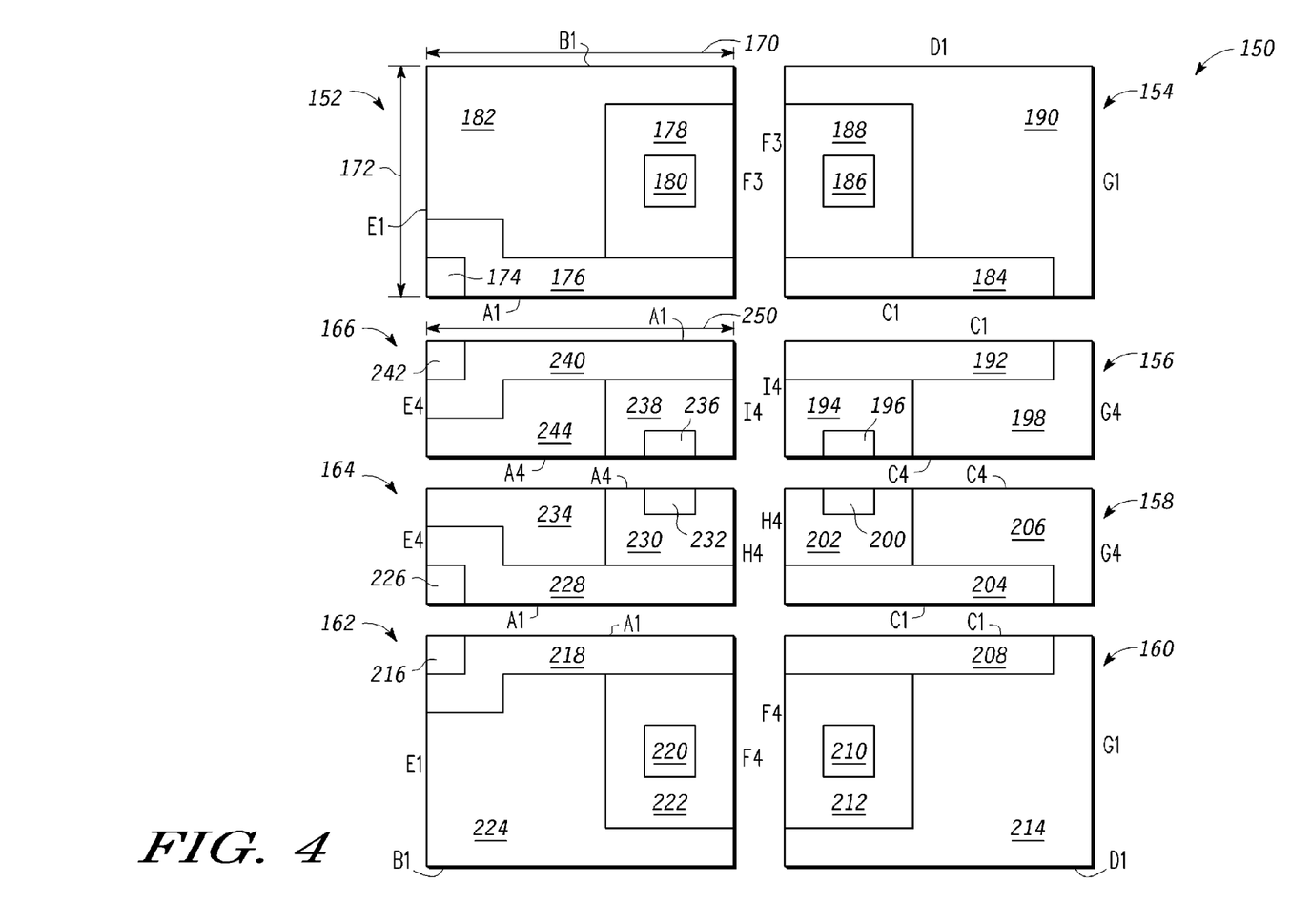
FIG. 4 is a schematic expanded layout view of primitive cells of yet another physical design layout, the primitive cells comprising one or more different sizes and including one or more (i) partial-layout features and/or (ii) full-layout features, according to yet another embodiment of the present disclosure.

FIG. 4 is a schematic expanded layout view 150 of primitive cells of yet another physical design layout, the primitive cells comprising one or more different sizes and including one or more (i) partial-layout features and/or (ii) full-layout features, according to yet another embodiment of the present disclosure. The layout view 150 of FIG. 4 is similar to those of FIGS. 1 and 3, with various differences as explained in the following. In FIG. 4, the primitive cells are generally indicated by reference numerals 152, 154, 156, 158, 160, 162, 164 and 166. Each primitive cell includes four side edges, wherein each side edge of the primitive cell is characterized by a predetermined edge code. Edge codes are illustrated in FIG. 4, for example, represented by B1, F3, A1, E1, D1, G1, C1, I4, A4, E4, G4, C4, H4, E4, G4 and F4.

Primitive cell 152 includes both partial-layout features (174, 176 and 178) and a full-layout feature (180). Furthermore, a portion of primitive cell 152 includes a region or feature other than partial-layout or full-layout features, generally indicated by reference numeral 182. In FIG. 4, the primitive cell 152 is representative of a portion of a transistor layout, wherein partial-layout feature 176 is representative of a portion of a gate electrode, partial layout feature 174 is representative of a portion of a gate electrode contact, and partial-layout layout feature 178 is representative of a portion of an active the transistor device, in particular, a source/drain region. The full-layout feature 180 is representative of an active area contact. Region 182 is representative of an isolation region.

Primitive cell 154 includes both partial-layout features (184 and 188) and a full-layout feature (186). Furthermore, a portion of primitive cell 154 includes a region or feature other than partial-layout or full-layout features, generally indicated by reference numeral 190. In FIG. 4, the primitive cell 154 is representative of a portion of a transistor layout, wherein partial-layout feature 184 is representative of a portion of a gate electrode and partial-layout feature 188 is representative of a portion of an active region of the transistor device. The full-layout feature 186 is representative of an active area contact. Region 190 is representative of an isolation region.

Primitive cell 156 includes partial-layout features (192, 194 and 196). In addition, a portion of primitive cell 156 includes a region or feature other than partial-layout or full-layout features, generally indicated by reference numeral 198. In FIG. 4, the primitive cell 156 is representative of a portion of a transistor layout, wherein partial-layout feature 192 is representative of a portion of a gate electrode, partial-layout feature 194 is representative of a portion of an active region of the transistor device, and partial-layout feature 196 is representative of a portion of an active area contact. Region 198 is representative of an isolation region. Primitive cell 158 is similar to primitive cell 156. In particular, partial-layout features (204, 202 and 200) of primitive cell 158 are similar to partial-layout features (192, 194 and 196) of primitive cell 156, respectively. In addition, region 206 of primitive cell 158 is similar to region 198 of primitive cell 156.

Primitive cell 160 is similar to primitive cell 154. In particular, the partial-layout features (208 and 212) and full-layout feature (210) of primitive cell 160 are similar to the partial-layout features (184 and 188) and full-layout feature (186) of primitive cell 154, respectively. In addition, region 214 of primitive cell 160 is similar to region 190 of primitive cell 154.

Primitive cell 162 is similar to primitive cell 152. In particular, the partial-layout features (216, 218 and 222) and full-layout feature (220) of primitive cell 162 are similar to the partial-layout features (174, 176 and 178) and full-layout feature (180) of primitive cell 152, respectively. In addition, region 224 of primitive cell 162 is similar to region 182 of primitive cell 152.

Primitive cell 164 includes partial-layout features (226, 228, 230 and 232). In addition, a portion of primitive cell 164 includes a region or feature other than partial-layout or full-layout features, generally indicated by reference numeral 234. In FIG. 4, the primitive cell 164 is representative of a portion of a transistor layout, wherein partial-layout feature 226 is representative of a portion of a gate electrode contact, partial-layout feature 228 is representative of a portion of a gate electrode, partial-layout feature 230 is representative of a portion of an active region of the transistor device, and partial-layout feature 232 is representative of a portion of an active area contact. Region 234 is representative of an isolation region. Primitive cell 166 is similar to primitive cell 164. In particular, partial-layout features (242, 240, 238 and 236) of primitive cell 166 are similar to partial-layout features (226, 228, 230 and 232) of primitive cell 164, respectively. In addition, region 244 of primitive cell 166 is similar to region 234 of primitive cell 164.

Further with respect to FIG. 4, primitive cell 152 has length and width dimensions that are indicated by reference numerals 170 and 172, respectively. In one embodiment, the length and width dimensions of a given primitive cell are not equal. In another embodiment, the length and width dimension of a given primitive cell are equal. Further as illustrated in FIG. 4, a length dimension 250 of primitive cell 166 is equal to the length dimension 170 of primitive cell 152. Further as shown in FIG. 4, the layout 150 includes primitive cells of differing dimensions.

Figure 5:
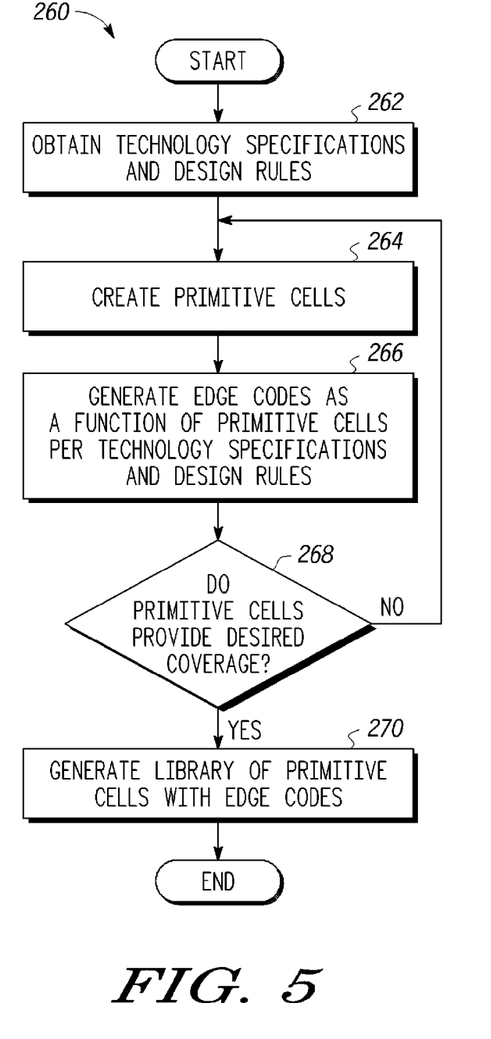
FIG. 5 is a flowchart view of a method of creating primitive cells, generating edge codes, and generating a library of primitive cells with edge codes according to one embodiment of the present disclosure.

FIG. 5 is a flowchart view 260 of a method of creating primitive cells, generating edge codes, and generating a library of primitive cells with edge codes according to one embodiment of the present disclosure. To begin, step 262 includes obtaining technology specification and design rules for a given semiconductor technology. In step 264, the method includes creating primitive cells. In step 266, the method includes generating edge codes as a function of primitive cells per technology specifications and design rules. In step 268, the method includes a query of whether the primitive cells provide a desired coverage. If not, then the method returns to step 264 and continues with creation of an additional one or more primitive cells. If in step 268, the created primitive cells provide the desired coverage, then the process proceeds to step 270. In step 270, the method includes generating a library of primitive cells with edge codes and then ends.

Figure 6:
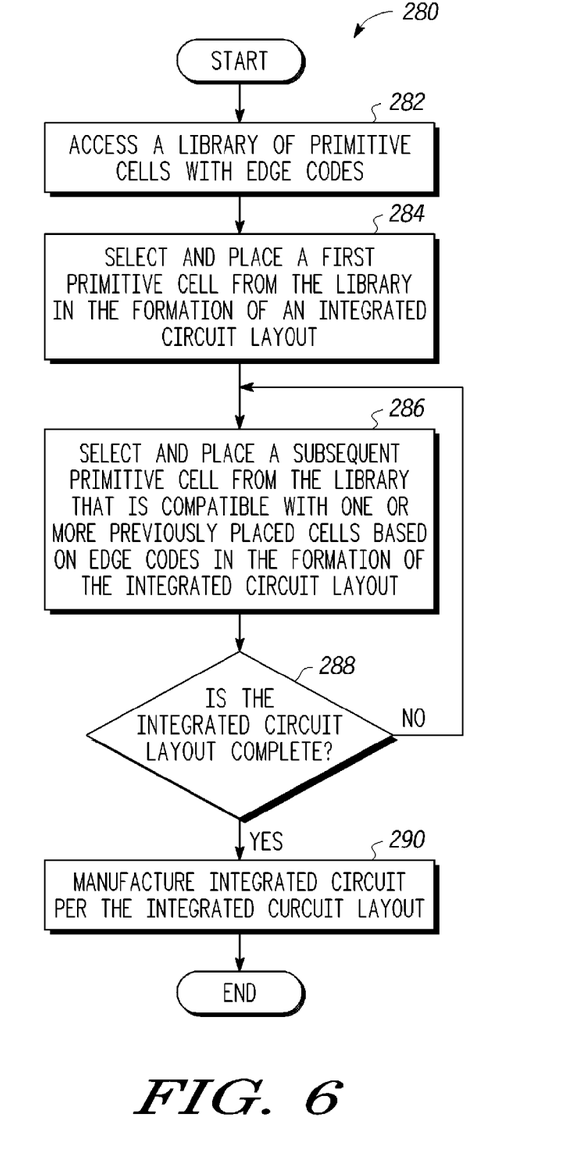
FIG. 6 is a flowchart view of a method of generating an integrated circuit layout using primitive cells with edge codes in the manufacturing of an integrated circuit according to another embodiment of the present disclosure.

FIG. 6 is a flowchart view 280 of a method of generating an integrated circuit layout using primitive cells with edge codes in the manufacturing of an integrated circuit according to another embodiment of the present disclosure. To begin, step 282 includes accessing a library of primitive cells with edge codes. In step 284, the method includes selecting and placing a first primitive cell from the library in the formation of an integrated circuit layout. In step 286, the method includes selecting and placing a subsequent primitive cell from the library that is compatible with one or more previously placed cells based on edge codes in the formation of the integrated circuit layout. In step 288, the method includes a query of whether the integrated circuit layout is complete. If not, then the method returns to step 286 and continues with selecting and placing a subsequent primitive cell from the library. If in step 288, the integrated circuit layout is complete, then the process proceeds to step 290. In step 290, the method includes manufacturing the integrated circuit per the integrated circuit layout and then ends.

As disclosed herein, in one embodiment a method for forming an integrated circuit comprises accessing a library of primitive cells and edge codes in the formation of an integrated circuit layout. Using at least one edge code of at least one previously placed primitive cell of the integrated circuit layout, the method includes selecting a primitive cell from the library that is compatible with the at least one previously placed primitive cell and placing the selected primitive cell into the integrated circuit layout adjacent the at least one previously placed primitive cell. The integrated circuit is subsequently manufactured according to or with use of the integrated circuit layout. In one embodiment, the edge codes provide compatibility information with respect to edges of the primitive cells. In another embodiment, prior to manufacturing the integrated circuit, the method further comprises repeating the selecting and placing. Furthermore, in another embodiment, for a given integrated circuit layout, edge codes of abutting edges of previously placed primitive cells indicate that the abutting edges are compatible. Still further, at least a subset of the primitive cells in the library includes a partial layout feature which is representative of a portion of a semiconductor device of the integrated circuit.

According to another embodiment, a method for forming an integrated circuit comprises selecting a first primitive cell from a library having a plurality of primitive cells, each of the plurality of primitive cells having at least one corresponding edge code. The first primitive cell is placed in the formation of an integrated circuit layout. A second primitive cell is selected from the library. The second primitive cell is placed adjacent the first primitive cell in the integrated circuit layout, wherein at least one edge code of the first primitive cell is compatible with at least one edge code of the second primitive cell. The integrated circuit is subsequently manufactured using the integrated circuit layout. In addition, the at least one edge code corresponding to each of the plurality of primitive cells provides compatibility information with respect to at least one edge of the each of the plurality of primitive cells.

In another embodiment, the first primitive cell has a first edge and a corresponding first edge code and the second primitive cell has a first edge and a corresponding first edge code. Placing the second primitive cell adjacent the first primitive cell comprises placing the first edge of the first primitive cell adjacent the first edge of the second primitive cell, wherein the first edge code of the first primitive cell is compatible with the first edge code of the second primitive cell. In another embodiment, each of the plurality of primitive cells in the library comprises a plurality of edges, wherein each of the plurality of edges have an edge code associated therewith which provides edge compatibility information.

In yet another embodiment, the method of forming an integrated circuit, prior to manufacturing the integrated circuit, further comprises using at least one edge code of at least one of the first primitive cell or the second primitive cell to select a third primitive cell from the library and placing the third primitive cell adjacent the at least one of the first primitive cell or the second primitive cell in the integrated circuit layout. At least one edge code of the third primitive cell is compatible with at least one edge code of the at least one of the first primitive cell or the second primitive cell. In addition, each of the plurality of primitive cells can comprise at least one partial layout feature corresponding to a portion of a semiconductor device of the integrated circuit.

The first primitive cell can comprise a first partial layout feature corresponding to a first portion of a semiconductor device of the integrated circuit, and the second primitive cell can comprise a second partial layout feature corresponding to a second portion of the semiconductor device of the integrated circuit. In one embodiment, the first portion and the second portion of the semiconductor device do not complete the semiconductor device. In another embodiment, each of the plurality of primitive cells has a same height and each of the plurality of cells has a same width. In a further embodiment, selecting the second primitive cell comprises using the at least one edge code of the first primitive cell to select the second primitive cell.

According to yet another embodiment, a method for forming an integrated circuit comprises selecting a first primitive cell from a library having a plurality of primitive cells. The first primitive cell can include a partial layout feature representative of a first portion of a semiconductor device of the integrated circuit, and a plurality of edges, each edge of the plurality of edges having a corresponding edge code. The method further includes placing the first primitive cell in the formation of an integrated circuit layout. A second primitive cell is selected from the library, the second primitive cell including a partial layout feature representative of a second portion of the semiconductor device of the integrated circuit, and a plurality of edges, each edge of the plurality of edges having a corresponding edge code. The second primitive cell is placed in the integrated circuit layout, wherein a first edge of the second primitive cell is adjacent a first edge of the first primitive cell, and a first edge code of the first edge of the second primitive cell is compatible with a first edge code of the first edge of the first primitive cell. Subsequently, the integrated circuit is manufactured according to or using the integrated circuit layout.

According to further embodiments, selecting the second primitive cell can comprise using the first edge code of the first edge of the first primitive cell to select the second primitive cell. In another embodiment, the first portion and the second portion complete the semiconductor device. In another embodiment, the first portion and the second portion do not complete the semiconductor device, wherein additional portions are needed to complete the semiconductor device. In a further embodiment, the first primitive cell has a same height as a height of the second primitive cell and a same width as a width of the second primitive cell.

The method according to the embodiments of the present disclosure improves a speed of physical design. For example, place-and-route tools could be used at the primitive level, since Design-for-manufacturability practices would be designed into the primitives. In another example, if higher level cells or a custom layout is done, then manual CAD tools could be configured to do real time abutment check. The relative simplicity of abutment rules, compared to layer-by-layer layout rules, enables such real-time checking during manual layout. Furthermore, the primitive cells and their abutment rules constrain the spectrum of pitches and spaces to discrete values. These discrete values would be reflected in the front-end models, and would obviate the need for post-layout extraction for the front-end simulation models to comprehend proximity effects of stressors, etc.

The primitive cell design according to the embodiments of the present disclosure addresses and resolves various process related issues. For example, in the present art, design rules are written, however complex, and then translated into a CAD tool language for automated checking. Besides the requirement for a design to not violate design rules, the layout has tended to be irregular. Current methods for simulating front-end devices with arbitrary (albeit, design rule clean) layouts is to extract the physical spaces and pitches, and feed the extracted values back into the simulation environment. In contrast, the embodiments of the present disclosure restrict the physical layout to discrete values, and more particularly, provide exact physical layout primitives or primitive cells. As a result, the predictability and accuracy of simulated design performance is improved. Furthermore, the embodiments of the present disclosure can be used to provide a front-end physical design (layout) for any technology.

The embodiments of the present disclosure thus address the problems of the prior art variations on a wafer due to layout, and overcome difficulties in modeling the electrical behavior due to layout variations. In addition, the embodiments of the present disclosure relate to primitive cells, compared with other types of cells that are at a minimum, a complete device or set of interconnected devices.

The embodiments of the present disclosure can be useful for anyone who manufactures or designs semiconductor products, as well as those who provide CAD tools and associated libraries. In addition, the embodiments of the present disclosure can be implemented as a new level of library cells. Furthermore, the embodiments of the present disclosure enable physical layout itself to be a quicker process and one that is less prone to error than prior known layout techniques.

Still further, the embodiments of the present disclosure relate to non-functional primitive cells that are technology independent and that solve the problems in the art as listed herein. The embodiments include a method wherein a front-end integrated circuit or semiconductor device layout can be done using pre-defined primitive elements, which can constitute, for example, small portions of transistors. The primitive cells include edge tagged cells, such that only the intended abutment possibilities are allowed. The allowed abutments are based on a process capability such that correct placement/abutment of the primitive cells guarantees a manufacture-able layout by construction. In addition, place-and-route tools could be used for the manufacturing of an integrated circuit according to the embodiments of the present disclosure, since best design-for-manufacturability practices would be built into the primitive cells. For higher level standard cells or custom layout, manual CAD tools could be configured to do real-time check of the relatively simple abutment rules. Furthermore, the primitive cells and their corresponding abutment rules would constrain all pitches and spaces. The small number of configurations would be captured in the front end models, and would obviate the need for post-layout extraction for the front end models to comprehend proximity effects of stressors, etc.

The embodiments of the present disclosure include front end physical design (layout) primitive cells assembled into a library. The primitive cell edges are tagged with allowed abutments and, when joined, form complete functional devices such as transistors. The primitive cells can be pieced together either through automated place and route, or manually, to achieve the final physical design. In response to being placed consistently with the edge tagging, the layout is guaranteed by construction to meet all design rules. As described herein, the primitive elements by themselves are not electrically functional. The embodiments discussed herein enable physical designs that minimize variation and enables accurate modeling. This is accomplished by encoding the edges of primitive cells with allowed abutment or placement information. Primitive layout elements which can be assembled to form electrically functional circuit elements (e.g., transistors) include layout elements having edges that are coded with allowed or forbidden placement information, and which ensure the resulting layout is design rule compliant. The embodiments of the present disclosure enable more manufacturable designs to be generated that are more likely to behave electrically as they do in design (i.e., via simulation).

In the foregoing specification, the disclosure has been described with reference to the various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming an integrated circuit, comprising:
   accessing a library of primitive cells and edge codes in the formation of an integrated circuit layout, wherein each primitive cell includes four side edges, each side edge being characterized by a predetermined edge code, each primitive cell further including (i) parital-layout features and (ii) a portion thereof that includes a region or feature other than partial-layout features, wherein the partial layout features comprise features selected from the group consisting of a portion of a gate electrode, a portion of an active region of a transistor device, and a portion of an active area contact, and wherein each partial-layout feature by itself would not suffice as a functional portion of a semiconductor device of the integrated circuit;
   using at least one edge code of at least one previously placed primitive cell of the integrated circuit layout, selecting a primitive cell from the library based upon an edge code of the primitive cell with compatibility information of the at least one edge code of the at least one previously placed primitive cell and placing the selected primitive cell into the integrated circuit layout adjacent the at least one previously placed primitive cell based upon the corresponding edge code compatibility, wherein the compatibility information comprises information for identification of edges of other primitive cells that the selected primitive cell can be adjacent to in the integrated circuit layout; and
   manufacturing the integrated circuit using the integrated circuit layout.

2. The method of claim 1, prior to manufacturing the integrated circuit, further comprising repeating the selecting and placing.

3. A method for forming an integrated circuit comprising:
   selecting a first primitive cell from a library having a plurality of primitive cells, each primitive cell including four side edges, each side edge being characterized by a predetermined edge code, each primitive cell further including (i) parital-layout features and (ii) a portion thereof that includes a region or feature other than partial-layout features, wherein the partial layout features comprise features selected from the group consisting of a portion of a gate electrode, a portion of an active region of a transistor device, and a portion of an active area contact, and wherein each partial-layout feature by itself would not suffice as a functional portion of a semiconductor device of the integrated circuit;

placing the first primitive cell in the formation of an integrated circuit layout;

selecting a second primitive cell from the library based upon an edge code of the second primitive cell with compatibility information of at least one edge code of the first primitive cell, wherein the compatibility information comprises information for identification of edges of primitive cells that the selected second primitive cell can be adjacent to in the integrated circuit layout;

placing the second primitive cell adjacent the first primitive cell in the integrated circuit layout based upon the corresponding edge code compatibility; and manufacturing the integrated circuit using the integrated circuit layout.

4. The method of claim 3, prior to manufacturing the integrated circuit, further comprising:

using at least one edge code of at least one of the first primitive cell or the second primitive cell to select a third primitive cell from the library; and placing the third primitive cell adjacent the at least one of the first primitive cell or the second primitive cell in the integrated circuit layout, wherein at least one edge code of the third primitive cell is compatible with at least one edge code of the at least one of the first primitive cell or the second primitive cell.

5. The method of claim 3, wherein each of the plurality of primitive cells has a same height and each of the plurality of cells has a same width.

* * * * *

UNITED STATES PATENT AND TRADEMARK OFFICE
CERTIFICATE OF CORRECTION

PATENT NO. : 7,386,821 B2  Page 1 of 1
APPLICATION NO. : 11/423240
DATED : June 9, 2006
INVENTOR(S) : Jack M. Higman

It is certified that error appears in the above-identified patent and that said Letters Patent is hereby corrected as shown below:

In Column 12, Line 36, Claim No. 1:
    Change "parital-layout" to --partial-layout--

In Column 13, Line 2, Claim No. 3:
    Change "parital-layout" to --partial-layout--

Signed and Sealed this

Second Day of September, 2008

JON W. DUDAS
*Director of the United States Patent and Trademark Office*

UNITED STATES PATENT AND TRADEMARK OFFICE
CERTIFICATE OF CORRECTION

PATENT NO. : 7,386,821 B2  
APPLICATION NO. : 11/423240  
DATED : June 10, 2008  
INVENTOR(S) : Jack M. Higman Page 1 of 1

It is certified that error appears in the above-identified patent and that said Letters Patent is hereby corrected as shown below:

In Column 12, Line 36, Claim No. 1:
    Change "parital-layout" to --partial-layout--

In Column 13, Line 2, Claim No. 3:
    Change "parital-layout" to --partial-layout--

This certificate supersedes the Certificate of Correction issued September 2, 2008.

Signed and Sealed this

Thirtieth Day of September, 2008

JON W. DUDAS  
*Director of the United States Patent and Trademark Office*